(12) United States Patent
Maibara

(10) Patent No.: US 9,935,609 B2
(45) Date of Patent: Apr. 3, 2018

(54) PIEZOELECTRIC COMPONENT

(71) Applicant: KYOCERA Corporation, Kyoto-shi, Kyoto (JP)

(72) Inventor: Shunsuke Maibara, Kyoto (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 0 days.

(21) Appl. No.: 15/306,899

(22) PCT Filed: Apr. 28, 2015

(86) PCT No.: PCT/JP2015/062823
§ 371 (c)(1),
(2) Date: Oct. 26, 2016

(87) PCT Pub. No.: WO2015/178178
PCT Pub. Date: Nov. 26, 2015

(65) Prior Publication Data
US 2017/0047906 A1    Feb. 16, 2017

(30) Foreign Application Priority Data
May 17, 2014    (JP) .................................. 2014-102912

(51) Int. Cl.
*H03H 9/19*    (2006.01)
*H03H 9/17*    (2006.01)
(Continued)

(52) U.S. Cl.
CPC .......... *H03H 9/17* (2013.01); *H03H 9/02062* (2013.01); *H03H 9/02086* (2013.01);
(Continued)

(58) Field of Classification Search
CPC ........ H03H 9/17; H03H 9/177; H03H 9/1021; H03H 9/1014; H03H 9/1035; H03H 9/1028; H03H 9/105; H03H 9/172
See application file for complete search history.

(56) References Cited

U.S. PATENT DOCUMENTS 4,216,402 A * 8/1980 Engdahl .................. G04F 5/063
310/320
5,585,687 A * 12/1996 Wakabayashi ....... H03H 9/1014
310/344
(Continued)

FOREIGN PATENT DOCUMENTS

JP        53132988 A * 11/1978 ............. H03H 9/177
JP     2006-067496 A    3/2006
(Continued)

OTHER PUBLICATIONS

Extended European Search Report, European Patent Application No. 15795988.3, dated Nov. 30, 2017, 10 pgs.

*Primary Examiner* — J. San Martin
(74) *Attorney, Agent, or Firm* — Volpe and Koenig, P.C.

(57) ABSTRACT

A piezoelectric component which suppress ripples in the range of oscillation frequency and achieves stabilization of oscillation frequency is provided. A piezoelectric component of the invention includes a support substrate; a piezoelectric element having an elongated shape, comprising excitation electrodes disposed on one principal surface and the other principal surface thereof, respectively, the excitation electrodes facing each other; a first support portion and a second support portion which are disposed between both ends in a longitudinal direction of the piezoelectric element and the support substrate; and an electrically conductive joining material which joins the first support portion and the second support portion to the ends of the piezoelectric element, respectively. A center of the piezoelectric element is offset (Continued)

with respect to an intermediate point between the first support portion and the second support portion as seen in a plan view of the piezoelectric component.

8 Claims, 5 Drawing Sheets

(51) Int. Cl.
  *H03H 9/05* (2006.01)
  *H03H 9/10* (2006.01)
  *H03H 9/02* (2006.01)

(52) U.S. Cl.
  CPC ............ *H03H 9/05* (2013.01); *H03H 9/0504* (2013.01); *H03H 9/1014* (2013.01); *H03H 9/177* (2013.01); *H03H 9/02157* (2013.01); *H03H 9/0514* (2013.01)

(56) References Cited

U.S. PATENT DOCUMENTS

| | | | |
|---|---|---|---|
| 6,163,101 A | 12/2000 | Yoshida et al. | |
| 6,636,130 B2 * | 10/2003 | Gamo | H03H 9/0542 |
| | | | 310/366 |
| 8,368,476 B2 * | 2/2013 | Mikami | H03H 9/1021 |
| | | | 310/348 |
| 9,431,995 B2 * | 8/2016 | Yamashita | H03H 9/19 |
| 9,716,484 B2 * | 7/2017 | Yamashita | H03H 9/02102 |
| 2007/0090725 A1 | 4/2007 | Kamiyama et al. | |
| 2011/0260586 A1 | 10/2011 | Kawase et al. | |
| 2013/0250527 A1 * | 9/2013 | Hatanaka | H01L 23/295 |
| | | | 361/748 |
| 2014/0021829 A1 * | 1/2014 | Kubota | H03H 9/1021 |
| | | | 310/351 |
| 2015/0108875 A1 | 4/2015 | Yang et al. | |
| 2015/0333728 A1 * | 11/2015 | Iwakawa | H03H 9/02086 |
| | | | 310/353 |
| 2017/0026028 A1 * | 1/2017 | Takase | H03H 9/0552 |

FOREIGN PATENT DOCUMENTS

WO   WO 2007023685 A1 *  3/2007  .......... H03H 9/0595
WO        2013168339 A1    11/2013

* cited by examiner

PIEZOELECTRIC COMPONENT

TECHNICAL FIELD

The present invention relates to a piezoelectric component which is suitably used as a resonator, for example.

BACKGROUND ART

A piezoelectric component which serves as a resonator comprises a support substrate, a piezoelectric element, a pair of support portions for the installation of the piezoelectric element, an electrically conductive joining material, and a lid body. The piezoelectric element has vibrating electrodes formed on opposite principal surfaces thereof, respectively, so as to have mutually opposed regions (intersecting regions). The piezoelectric element is installed, with its one and the other ends arranged in symmetrical relation on their respective paired support portions disposed on the support substrate. That is, the center of the piezoelectric component coincides with an intermediate point between the first support portion and the second support portion as seen in a plan view.

CITATION LIST

Patent Literature

Patent Literature 1: Japanese Unexamined Patent Publication JP-A 2006-67496

SUMMARY OF INVENTION

Technical Problem

In the resonator, harmonic components (higher-order vibration) of longitudinal vibration mode, transverse vibration mode, or planar-extensional vibration mode occur as so-called ripples in the range of oscillation frequency. Increasingly greater ripples may lead to lack of stability in oscillation frequency.

The invention has been devised in view of the circumstances as discussed above, and accordingly an object of the invention is to provide a piezoelectric component which achieves suppression of ripples in the range of oscillation frequency and is thus conducive to stabilization of oscillation frequency.

Solution to Problem

The invention provides a piezoelectric component comprising: a support substrate; a piezoelectric element having an elongated shape, comprising excitation electrodes disposed on one principal surface and the other principal surface thereof, respectively, the excitation electrodes facing each other; a first support portion and a second support portion which are disposed between both ends in a longitudinal direction of the piezoelectric element and the support substrate; and an electrically conductive joining material which joins the first support portion and the second support portion to the ends of the piezoelectric element, respectively, a center of the piezoelectric element being offset with respect to an intermediate point between the first support portion and the second support portion as seen in a plan view of the piezoelectric component.

Advantageous Effects of Invention

According to the invention, since the center of the piezoelectric element is offset from the intermediate point between the first support portion and the second support portion, it follows that the degree of symmetry in the vibrating electrode-bearing region which is not secured by the electrically conductive joining material is lowered. This makes it possible to shift ripple frequency within the range of oscillation frequency to go out of the oscillation frequency range, or reduce ripples within the oscillation frequency range.

DESCRIPTION OF EMBODIMENTS

A piezoelectric component in accordance with a present embodiment will be particularized with reference to drawings.

Figure 1:
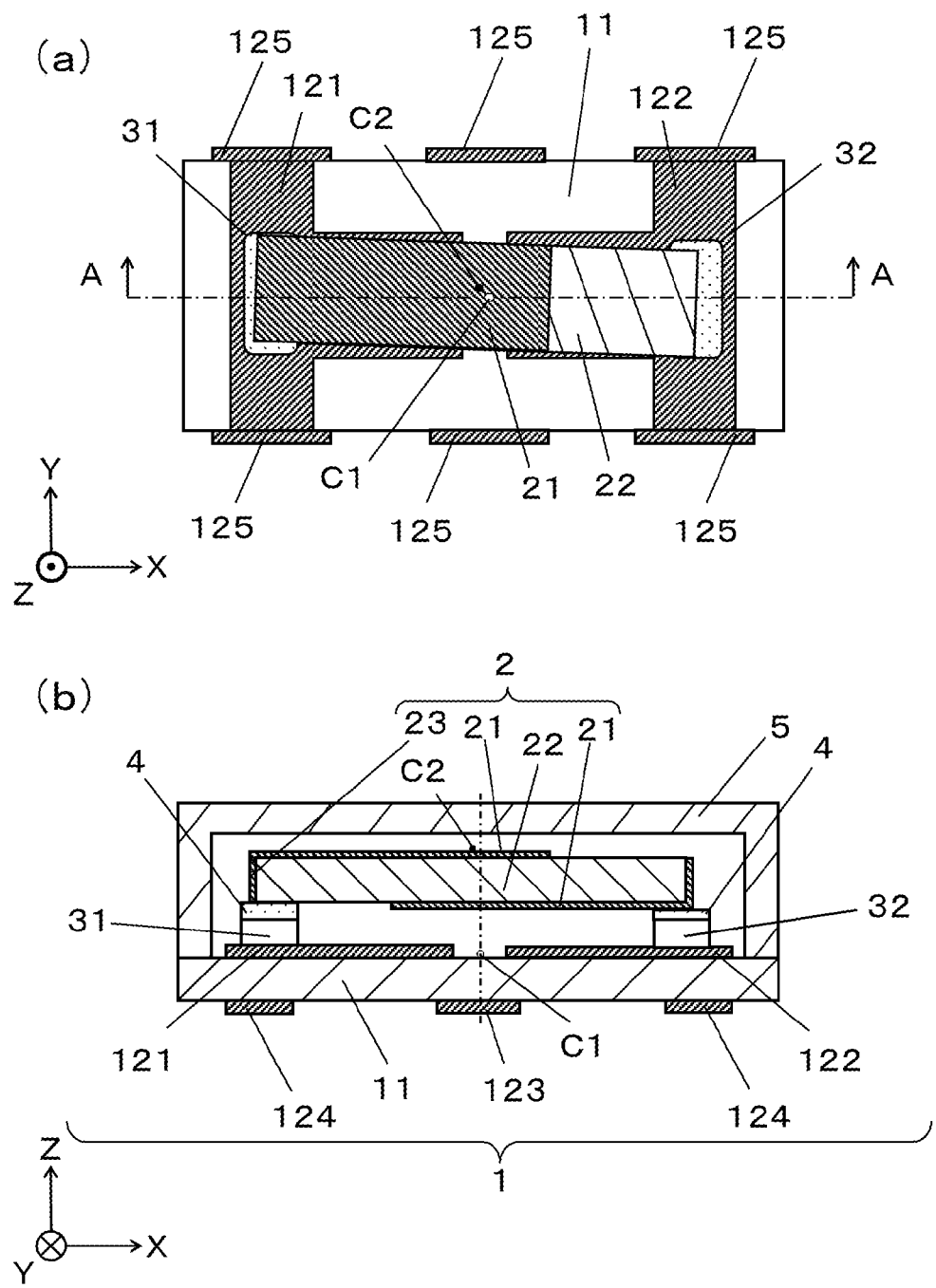
FIG. 1($a$) is a schematic plan view, with parts omitted, showing an example of a piezoelectric component according to this embodiment, and, FIG. 1($b$) is a schematic sectional view showing the piezoelectric component taken along the line A-A shown in FIG. 1($a$)

FIG. 1($a$) is a schematic plan view, with parts (lid body) omitted, showing a piezoelectric component according to this embodiment, and, FIG. 1($b$) is a schematic sectional view showing the piezoelectric component taken along the line A-A shown in FIG. 1($a$).

The piezoelectric component as exemplified in FIG. 1 comprises: a support substrate 1; an elongated piezoelectric element 2 comprising vibrating electrodes 21 disposed on one principal surface and the other principal surface thereof, respectively, the vibrating electrodes facing each other; a first support portion 31 and a second support portion 32 which are disposed on the support substrate 1, and are connected to the other principal surface (lower surface, in this embodiment) of the piezoelectric element 2 so as to support both ends in a longitudinal direction of the piezoelectric element 2; and an electrically conductive joining material 4 which joins the first support portion 31 and the second support portion 32 to the other principal surface at the ends of the piezoelectric element 2, respectively, wherein, a center C2 of the piezoelectric element 2 is offset with respect to an intermediate point C1 between the first support portion 31 and the second support portion 32 as seen in a plan view of the piezoelectric component.

For example, the support substrate 1 comprises a dielectric body 11 shaped in a rectangular flat plate which is 2.5 mm to 7.5 mm in length, 1.0 mm to 3.0 mm in width, and 0.1 mm to 1 mm in thickness. As the dielectric body 11, it is possible to use a ceramic material such as alumina or barium titanate and a resin material such as a glass epoxy resin.

One principal surface (upper surface, in this embodiment) of the dielectric body 11 constituting the support substrate 1 is provided with a first capacitive electrode 121 and a second capacitive electrode 122. The first capacitive electrode 121 and the second capacitive electrode 122 are electrically connected to the vibrating electrodes 21 of the piezoelectric element 2, respectively, and serve to form capacitance between each of them and a grounding electrode 123 which will hereafter be described. The first capacitive electrode 121 is disposed so as to extend from one end of the support substrate 1 in the longitudinal direction toward the center thereof, whereas the second capacitive electrode 122 is disposed so as to extend from the other end of the support substrate 1 in the longitudinal direction toward the center thereof.

The other principal surface (lower surface, in this embodiment) of the support substrate 1 is provided with the grounding electrode 123 opposed so as to straddle the first capacitive electrode 121 and the second capacitive electrode 122 through the dielectric body 11, and an input-output electrode 124 for input and output of signals.

Moreover, the support substrate 1 has, at a side surface thereof, a side electrode 125 which extends from one principal surface to the other principal surface, and electrically connects the first capacitive electrode 121 or the second capacitive electrode 122 to the input-output electrode 124.

As in this embodiment, when the first capacitive electrode 121 and the second capacitive electrode 122 are opposed to the grounding electrode 123 through the dielectric body 11, by setting the area of opposed regions of the first capacitive electrode 121 and the grounding electrode 123 to equal the area of opposed regions of the second capacitive electrode 122 and the grounding electrode 123, the capacitance obtained in each of the former opposed regions and the latter opposed regions is identical. Moreover, when the first capacitive electrode 121 and the second capacitive electrode 122 are opposed to the grounding electrode 123 through the dielectric body 11, it is possible to increase the area of opposed regions of the first capacitive electrode 121 and the grounding electrode 123 and the area of opposed regions of the second capacitive electrode 122 and the grounding electrode 123, and thereby obtain greater capacitance. Note that the capacitance obtained in the opposed regions of each electrode pair is determined in accordance with the characteristics of an amplifier circuit element which constitutes an oscillation circuit in conjunction with the piezoelectric component connected to the amplifier circuit element.

In the drawings, the side electrode 125 is also disposed on a part of the side surface of the support substrate 1 which is electrically connected to the grounding electrode 123 for purposes of convenience of soldering to an external circuit board.

As the material constituting the first capacitive electrode 121, the second capacitive electrode 122, the grounding electrode 123, and the side electrode 125, for example, it is possible to use an electrically conductive resin prepared by dispersing powder of metal such for example as gold, silver, copper, aluminum, or tungsten in a resin (electrically conductive paste) and a thick-film conductor obtained by baking of the metal powder with an additive such as glass added. The material in use may be formed with a plating such as a Ni/Au plating or a Ni/Sn plating on an as needed basis.

On the support substrate 1, there are arranged the first support portion 31 and the second support portion 32, and, the piezoelectric element 2 is mounted thereon so as to be able to vibrate. More specifically, with the first support portion 31 and the second support portion 32 connected to the other principal surface of the piezoelectric element 2, the piezoelectric element 2 is installed so as to be able to vibrate while being supported at its longitudinal ends on the first and second support portions 31 and 32. For example, the first support portion 31 and the second support portion 32 are each an electrically conductive columnar member made of a resin containing powder of metal such for example as gold, silver, copper, aluminum, or tungsten in a dispersed state. For example, each support portion is shaped in a rectangular prism or a circular cylinder which is 0.1 mm to 1.0 mm in longitudinal and transverse lengths (in diameter) and 10 µm to 100 µm in thickness.

Moreover, in FIG. 1, the electrically conductive joining material 4 is disposed on each of the first support portion 31 and the second support portion 32 to join each of the first support portion 31 and the second support portion 32 to at least the other principal surface at each end of the piezoelectric element 2. Since the first support portion 31 and the second support portion 32 are each made of an electrically conductive material, it follows that electrical conduction is established between the vibrating electrode 21 of the piezoelectric element 2 and each of the first support portion 31 and the second support portion 32. For example, solder or an electrically conductive adhesive is used as such an electrically conductive joining material 4. Exemplary of the solder is a lead-free material made of copper, tin, and silver, and, exemplary of the electrically conductive adhesive is an epoxy conductive resin or a silicone resin containing conductive particles of silver, copper, nickel, or the like in an amount of 75 to 95% by mass.

The piezoelectric element 2 is an elongated member comprising a piezoelectric body 22 and vibrating electrodes 21 disposed on opposite principal surfaces (one and the other principal surfaces) of the piezoelectric body 22, respectively, the vibrating electrodes facing each other. The piezoelectric body 22 constituting the piezoelectric element 2 may be shaped in a flat plate which is 1.0 mm to 4.0 mm in length, 0.2 mm to 2 mm in width, and 40 µm to 1 mm in thickness. The piezoelectric body 22 may be made of piezoelectric ceramics formed of, for example, lead titanate, lead zirconate titanate, lithium tantalate, lithium niobate, sodium niobate, potassium niobate, or a bismuth lamellar compound used as a base material.

Moreover, the piezoelectric element 2 has the vibrating electrodes 21 arranged on one and the other principal surfaces of the piezoelectric body 22, respectively, so as to have mutually opposed regions (intersecting regions). The vibrating electrode 21 disposed on one principal surface (upper surface) of the piezoelectric body 22 is formed so as to extend from one longitudinal end of the piezoelectric body 22 toward the other longitudinal end thereof, whereas the vibrating electrode 21 disposed on the other principal surface (lower surface) of the piezoelectric body 22 is formed so as to extend from the other longitudinal end toward the one longitudinal end, thus forming the mutually opposed regions. Each of the vibrating electrodes 21, which can be made of metal such for example as gold, silver, copper, or aluminum, is laminated in a thickness of 0.1 µm to 3 µm on the principal surface of the piezoelectric body 22. As shown in the drawings, an end electrode 23 is disposed on each end face of the piezoelectric element 2. The vibrating electrode 21 of the piezoelectric element 2 is electrically connected to the first capacitive electrode 121 via the end electrode 23, the electrically conductive joining material 4, and the first support portion 31, and, the other vibrating electrode 21 of the piezoelectric element 2 is electrically connected to the second capacitive electrode 122 via the electrically conductive joining material 4 and the second support portion 32.

In such a piezoelectric element 2, upon application of a voltage between the vibrating electrodes 21, piezoelectric vibration such as thickness longitudinal vibration or thickness sliding vibration occurs in the opposed regions (intersecting regions) of the vibrating electrodes 21 at a specific frequency.

As shown in FIG. 1(b), a lid body 5 may be placed on the support substrate 1 to cover the piezoelectric element 2. The lid body 5 is joined to the edge of the upper surface of the support substrate 1 by an adhesive or other means, thus providing the capability of protecting the piezoelectric element 2, which is housed in an internal space defined by the lid body 5 together with the support substrate 1, against external physical and chemical influences, and a hermetic sealing function to prevent intrusion of foreign matters such as water into the space defined by the lid body 5 together with the support substrate 1. As the material constituting the lid body 5, for example, it is possible to use metal such as stainless steel, ceramics such as alumina, a resin, and glass. It is also possible to use a material made of an insulating resin such as an epoxy resin containing inorganic fillers in an amount of 25 to 80% by mass in the interest of reduction of difference in thermal expansion coefficient between the lid body 5 and the support substrate 1.

The center C2 of the piezoelectric element 2 is offset with respect to the intermediate point C1 between the first support portion 31 and the second support portion 32 as seen in a plan view. As employed herein, the term "intermediate point C1 between the first support portion 31 and the second support portion 32" refers to a bisection point in which a line segment connecting the barycenter of the first support portion 31 and the barycenter of the second support portion 32 as seen in a plan view is bisected. Moreover, the center C2 of the piezoelectric element 2 means the barycenter of the piezoelectric element 2 as seen in a plan view. In reality, the position of the intermediate point C1 between the first support portion 31 and the second support portion 32 cannot be visually checked in a plan view in a condition where the piezoelectric element 2 is mounted thereon. Therefore, the offset positional relationship can be examined only when the piezoelectric element 2 is removed or represented in perspective, but, for the sake of convenience, it is assumed herein that there is an offset in a plan view.

In the case where the position of the center C2 of the piezoelectric element 2 is offset from the intermediate point C1 between the first support portion 31 and the second support portion 32, the degree of symmetry in the vibrating electrode 21-bearing region which is not secured by the electrically conductive joining material 4, namely, the vibrating region, is lowered. This makes it possible to shift ripple frequency within the range of oscillation frequency to go out of the oscillation frequency range, or reduce ripples within the oscillation frequency range.

At this time, a principal mode of vibration contributing to oscillation (for example, thickness sliding vibration) corresponds to vibration which occurs only in the intersecting regions of the vibrating electrodes 21 formed on the piezoelectric element 2, that is; a so-called energy-trapping vibration mode. Even if the ends of the piezoelectric element 2 are misaligned with respect to each other, the misalignment exerts no influence so long as the vibrating electrodes 21 defining the intersecting regions are maintained free from damage. Thus, a piezoelectric component characterized by stable oscillation frequency can be provided.

For example, in the piezoelectric element 2 which is 2.4 mm in longitudinal dimension, 0.5 mm in widthwise dimension, and 0.2 mm in thickness, it is assumed that ripples exist at 8.05 MHz. In this case, when the center C2 of the piezoelectric element 2 coincides with the intermediate point C1 between the first support portion 31 and the second support portion 32, there is a ripple phase difference of 15°. In this regard, it has been confirmed that the ripple phase difference can be reduced to 0.7° by displacing the center C2 of the piezoelectric element 2 from the intermediate point C1 by an amount of 0.2 mm in the longitudinal direction. That is, the displacement enables ripple suppression and reduction of the magnitude of the ripples.

It is noted that the center C2 of the piezoelectric element 2 may be displaced with respect to the intermediate point C1 between the first support portion 31 and the second support portion 32 in either a direction longitudinally of the piezoelectric element 2 or a transverse direction perpendicular to the longitudinal direction, or in both of these directions. In FIG. 1, there is shown a case where the center C2 of the piezoelectric element 2 is offset with respect to the intermediate point C1 both in the longitudinal direction and the transverse direction of the piezoelectric element 2.

For example, when higher-order vibration ascribable to longitudinal vibration (lengthwise vibration) appears as ripples in the range of frequencies of thickness sliding vibration (oscillation frequency range), it is advisable that the center C2 of the piezoelectric element 2 is offset with respect to the intermediate point C1 between the first support portion 31 and the second support portion 32 in the longitudinal direction of the piezoelectric element 2 (X direction in the drawing). Suitable adjustment of longitudinal displacement makes it possible to suppress ripples resulting from longitudinal vibration.

Moreover, when higher-order vibration ascribable to transverse vibration (widthwise vibration) appears as ripples in the range of frequencies of thickness sliding vibration (oscillation frequency range), it is advisable that the center C2 of the piezoelectric element 2 is offset with respect to the intermediate point C1 between the first support portion 31 and the second support portion 32 in the transverse direction perpendicular to the longitudinal direction of the piezoelectric element 2 (Y direction in the drawing). Suitable adjustment of transverse displacement makes it possible to suppress ripples resulting from transverse vibration.

In addition, when ripples occur due to higher-order vibration ascribable to both of longitudinal vibration and transverse vibration, it is advisable that the center C2 of the piezoelectric element 2 is offset with respect to the intermediate point C1 between the first support portion 31 and the second support portion 32 both in the longitudinal direction and the transverse direction of the piezoelectric element 2. Suitable adjustment of displacement in both of the longitudinal direction and the transverse direction makes it possible to suppress ripples resulting from each of longitudinal vibration and transverse vibration. At this time, as further adjustment, as shown in FIG. 1, the piezoelectric element 2 may be turned, and be displaced in at least one of the longitudinal direction and the transverse direction.

It is advisable that the distance of displacement of the piezoelectric element 2 in the X direction is equal to 0.8% to 15% of the longitudinal dimension of the piezoelectric element 2, and that the distance of displacement of the piezoelectric element 2 in the Y direction is equal to 4 to 30% of the transverse dimension of the piezoelectric element 2.

Such a distance is suitably determined with consideration given to the dimensions of the piezoelectric element 2 involving a shift of ripples or suppression of ripples, as well as to the positions of the first support portion 31 and the second support portion 32 involving the installation of the piezoelectric element 2.

Moreover, when the piezoelectric element 2 is not only simply displaced in the longitudinal and/or transverse direction but is also turned as shown in the drawing, expressed differently, when the longitudinal direction of the piezoelectric element 2 is inclined with respect to a line segment connecting the first support portion 31 and the second support portion 32, a part of the piezoelectric element 2 which is secured at the first support portion 31 and a part of the piezoelectric element 2 which is secured at the second support portion 32 differ from each other in widthwise dimension and in lengthwise dimension, thus throwing various vibration modes, including the transverse vibration mode, the longitudinal vibration mode, and the planar-extensional vibration mode off balance at a time. That is, the fundamental vibrations of the different vibration modes can be divided and damped at a time, and higher-order vibrations corresponding to these modes can thus be divided and damped at a time, with consequent suppression of ripples in the oscillation frequency range.

Figure 2:
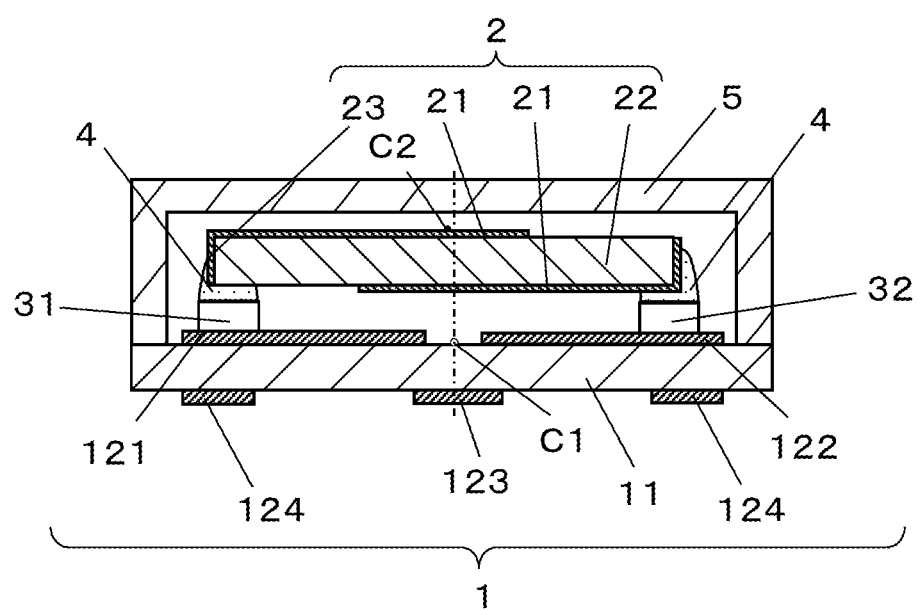
FIG. 2 is a schematic sectional view showing another example of the piezoelectric component according to the embodiment.

Moreover, as shown in FIG. 2, it is preferable that at least part of the side surface (end face) at each end of the piezoelectric element 2 is covered with the electrically conductive joining material 4. In other words, it is preferable that the electrically conductive joining material 4 which joins the piezoelectric element 2 and the support substrate 1 together is fixedly attached to the other principal surface and the side surface at each end of the piezoelectric element 2. In this case, the end of the piezoelectric element 2 can be secured firmly, wherefore harmonic vibration ascribable to longitudinal or transverse vibration, in particular, can be damped, with consequent further suppression of ripples in the oscillation frequency range.

Figure 3:
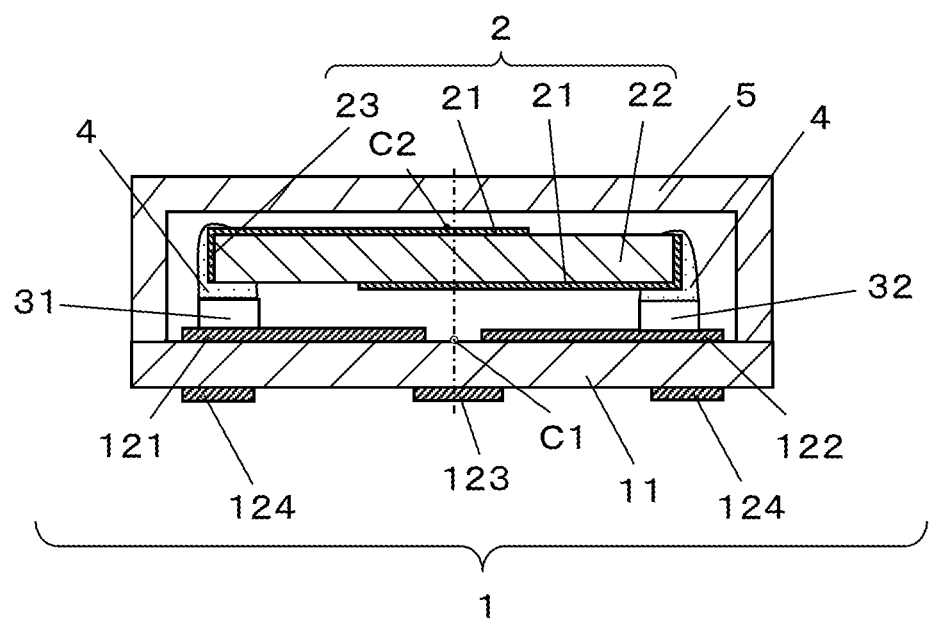
FIG. 3 is a schematic sectional view showing still another example of the piezoelectric component according to the embodiment.

Moreover, as shown in FIG. 3, it is preferable that at least part of one principal surface at each end of the piezoelectric element 2 is covered with the electrically conductive joining material 4. In other words, it is preferable that the electrically conductive joining material 4 which joins the piezoelectric element 2 and the support substrate 1 together is fixedly attached to the other principal surface, the side surface (end face), and one principal surface at each end of the piezoelectric element 2. When the electrically conductive joining material 4 is further extended fixedly to the one principal surface of the piezoelectric element 2, the end of the piezoelectric element 2 can be secured more firmly, wherefore harmonic vibration ascribable to longitudinal or transverse vibration, in particular, can be damped, with consequent further suppression of ripples in the oscillation frequency range.

Figure 4:
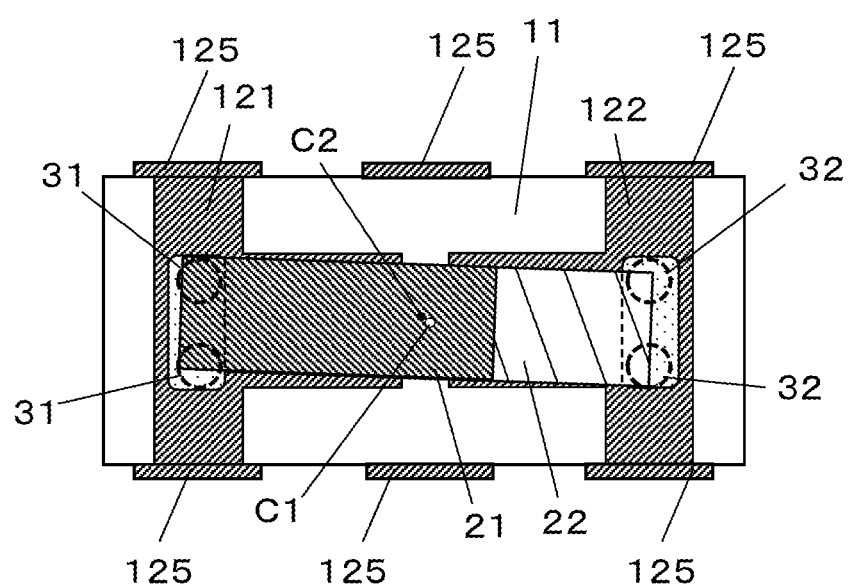
FIG. 4 is a schematic plan view, with parts omitted, showing still another example of the piezoelectric component according to the embodiment.

Moreover, as shown in FIG. 4, it is preferable that the first support portion 31 and the second support portion 32 are each composed of at least two or more bumps. In other words, it is preferable that the first support portion 31 and the second support portion 32 are each divided into two or more pieces. In the case where the first support portion 31 and the second support portion 32 are each composed of at least two or more bumps, the intermediate point C1 between the first support portion 31 and the second support portion 32 refers to a bisection point in which is bisected a line segment connecting the barycenter of a plurality of first support portions 31 and the barycenter of a plurality of second support portions 32 as seen in a plan view.

To begin with, the support substrate 1 is fixed in place, and the position of the center C2 of the piezoelectric element 2 is determined. Then, the piezoelectric element 2 is removed to uncover the end faces or sections of the plurality of first and second support portions 31 and 32, and, the barycenter of the first support portions 31 and the barycenter of the second support portions 32 are determined by graphic analyses, for example.

The barycenter of the plurality of first support portions 31 is determined on the basis of a line connecting the barycentric points of the individual first support portions 31. For example, when two first support portions 31 are provided, the barycenter of the first support portions 31 corresponds to a bisection point in which a line segment connecting the barycentric points of the individual first support portions 31 is bisected.

Moreover, when more than two first support portions 31 are provided, for example, an X-Y plane including a group of barycentric points of the individual first support portions 31 is assumed. Then, a given point in the X-Y plane is defined as an origin point, and, mutually perpendicular coordinate axes passing through the origin point are defined as the X axis and the Y axis, respectively. Given that the barycentric point of each of the first support portions 31 is represented by the Xi and Yi position coordinates, the total sum of the X and Y coordinate values at all the points is divided by the number of the points. On the basis of the value obtained by the above division, the barycenter of the plurality of first support portions 31 can be determined. For example, when there are five points, the barycenter of a group of the points (Xg and Yg coordinates) can be expressed in equation form as: Xg=(X1+X2+X3+X4+X5)/5; and Yg=(Y1+Y2+Y3+Y4+Y5)/5. This method holds true for the determination of the barycenter of the plurality of second support portions 32.

Moreover, the position of the intermediate point C1 corresponding to a bisection point in which a line segment connecting the barycenter of the plurality of first support portions 31 and the barycenter of the plurality of second support portions 32 is bisected, and the position of the center C2 of the piezoelectric element 2 are determined. From this a judgment can be made as to whether the foregoing falls within the scope of the invention.

FIG. 4 represents, partially in a transparent manner, the first support portion 31 and the second support portion 32 indicated by broken lines. In the case shown in FIG. 4, the electrically conductive joining material 4 is disposed so as to fill a gap between the first support portions 31, as well as a gap between the second support portions 32, and also fill a gap between the piezoelectric element 2 and the first capacitive electrode 121 or the second capacitive electrode 122. Since the division of each of the first support portion 31 and the second support portion 32 into two or more pieces and the displacement of the piezoelectric element 2 help lower the degree of symmetry in the fixed locations of the piezoelectric element 2 even further, it is possible to achieve further departure of harmonics of ripple-causing vibration mode from the oscillation frequency range.

For example, when the first support portion 31 and the second support portion 32 are each cylindrically shaped, it is advisable that 2 to 5 cylindrical members, each having a diameter equal to 20 to 40% of the width of the piezoelectric element 2, are spaced 100 to 300 μm apart for example, as the first support portions 31 or the second support portions 32. These support portions are advisably arranged so that the piezoelectric element 2 stays horizontal when installed. When two members are provided as the first support portions 31 or the second support portions 32, as shown in FIG. 4, the support portions are advisably arranged side by side in the transverse direction of the piezoelectric element 2.

Figure 5:
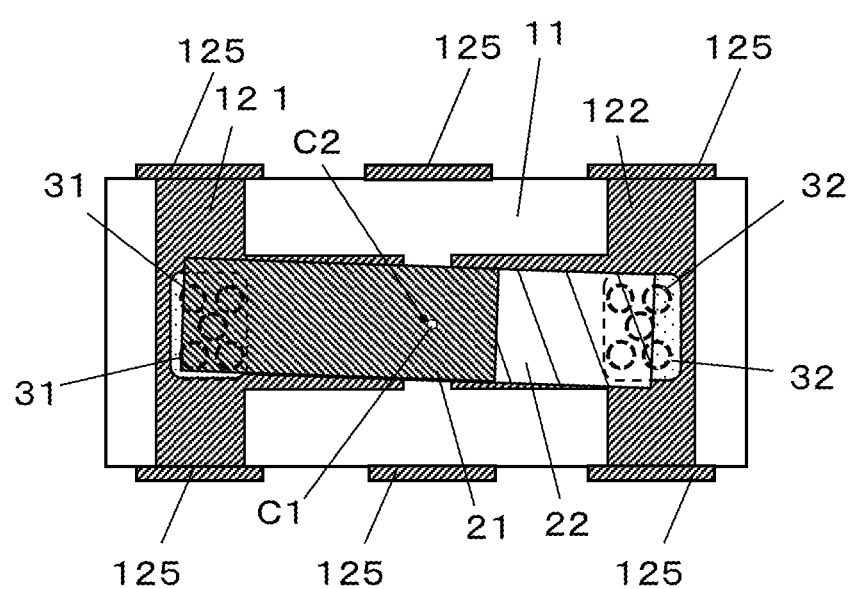
FIG. 5 is a schematic plan view, with parts omitted, showing still another example of the piezoelectric component according to the embodiment.

Moreover, when five members are provided as the first support portions 31 or the second support portions 32, as shown in FIG. 5, it is advisable that four of them are arranged so as to define the vertices of a square as seen in a plan view, and the remaining one is placed at the center of the square defined by the vertices from the standpoint of increasing the number of points of contact with the piezoelectric element 2 for stable installation of the piezoelectric element 2 in parallel with the support substrate 1. Also in this case, a principal mode of vibration corresponds to the so-called energy-trapping vibration mode, wherefore the construction is not subjected to the influence of component misalignment.

It should be understood that the application of the invention is not limited to the embodiments described heretofore, and that various changes and modifications are possible without departing from the scope of the invention.

The following describes a method of manufacturing the piezoelectric component in the present embodiment.

First, a segmentable substrate for the production of the support substrate 1. For example, powder of raw materials such as lead titanate, lead zirconate titanate, and barium titanate is mixed together with water and a dispersant in a ball mill, and, after the addition of a binder, a plasticizer, and so forth, the mixture is subjected to drying process and particle sizing process. The material thereby obtained is press-molded, and, the molded body is subjected to perforating process on an as needed basis, is degreased at a predetermined temperature, is fired at peak temperatures ranging from 900° C. to 1600° C., and is ground in a predetermined thickness. After that, for example, by printing an electrically conductive paste containing powder of metal such as silver or nickel and glass, performing firing at a predetermined temperature, and forming the first capacitive electrode 121, the second capacitive electrode 122, and so forth, the support substrate 1 is obtained.

On the support substrate 1 thus obtained, support portions are formed in a thickness of about 1 μm to 100 μm from an electrically conductive paste by means of screen printing or otherwise. More specifically, on the first capacitive electrode 121, for example, there is provided the first support portion 31 in the form of a bump formed by solidifying a resin containing dispersed metal powder, and, on the second capacitive electrode 122, for example, there is provided the second support portion 32 in the form of a bump formed by solidifying a resin containing dispersed metal powder.

Next, to obtain piezoelectric porcelain (piezoelectric body 22) constituting the piezoelectric element 2, for example, powder of raw materials is mixed together with water and a dispersant in a ball mill, and, after the addition of a binder, a plasticizer, and so forth, the mixture is subjected to drying process and particle sizing process. The material thereby obtained is press-molded and is then fired, forming the piezoelectric porcelain. An electrode is formed on the end face of the piezoelectric porcelain thus obtained, and, for example, a voltage of 0.4 kV/mm to 6 kV/mm is applied endways at a temperature of, for example, 25° C. to 300° C. to effect polarization.

The vibrating electrode 21 formed on each of the upper and lower surfaces of the piezoelectric body 22 is obtained by laminating a metallic film on each of the upper and lower surfaces of the piezoelectric body 22 thus obtained by means of vacuum deposition, PVD, sputtering, or otherwise, forming an about 1 to 10 μm-thick photoresist film on each metallic film by means of screen printing or otherwise, and performing patterning by photoetching. The piezoelectric element 2 is produced by cutting the patterned piezoelectric body 22 in a predetermined size by means of dicing or otherwise.

Then, the piezoelectric element 2 is fixedly mounted on the first support portion 31 and the second support portion 32 of the support substrate 1 via the electrically conductive joining material 4. When an electrically conductive adhesive made of a resin containing dispersed metal powder is used as the electrically conductive joining material 4, after applying the electrically conductive adhesive onto the first support portion 31 and the second support portion 32 by a dispenser or other means, the piezoelectric element 2 is placed on the first support portion 31 and the second support portion 32. Then, the resin constituting the electrically conductive adhesive is cured by application of heat or under ultraviolet irradiation.

To render the center C2 of the piezoelectric element 2 offset with respect to the intermediate point C1 between the first support portion 31 and the second support portion 32 as seen in a plan view, proper adjustment is made to the arrangement of the piezoelectric element 2 during its installation on the first support portion 31 and the second support portion 32. Moreover, by making proper adjustment to the amount of the electrically conductive joining material 4 or by applying the electrically conductive joining material 4 so that the electrically conductive joining material 4 extends to the side surface or upper surface of the piezoelectric element 2, it is possible to cover at least part of the side surface at each end of the piezoelectric element 2 with the electrically conductive joining material 4 or cover at least part of the upper surface at each end of the piezoelectric element 2 with the electrically conductive joining material 4. Furthermore, to obtain the first support portion 31 and the second support portion 32 which are each composed of at least two or more bumps, a plurality of bumps are provided as individual support portions.

Then, an opening periphery of the lid body 5 is joined to the edge of the upper surface of the support substrate 1 so as to cover the piezoelectric element 2. A segmentable lid cluster sheet having a plurality of recesses is used to form the lid body 5. The lid cluster sheet is placed on the segmentable substrate, with the recess positioned so as to cover the piezoelectric element 2, and, the projection of the lid cluster sheet, which constitutes the opening periphery of the lid body 5, is joined to the edge of the upper surface of the support substrate 1. For example, a thermosetting insulating adhesive is applied to the projection of the prepared lid cluster sheet constituting the opening periphery of the lid body 5, and, the lid body 5 is placed on the upper surface of the support substrate 1. After that, the lid body 5 or the support substrate 1 is subjected to heat to raise the temperature of the insulating adhesive to 100 to 150° C., thus curing the insulating adhesive, whereby the lid body 5 is joined to the upper surface of the support substrate 1.

Lastly, the assemblage is cut along the boundary between the individual piezoelectric components (component pieces) by means of dicing or otherwise.

The piezoelectric component in the present embodiment is produced in accordance with the method thus far described. This method enables production of the piezoelectric component that achieves suppression of ripples in the range of oscillation frequency and is thus conducive to stabilization of oscillation frequency with high productivity.

REFERENCE SIGNS LIST

1: Support substrate
11: Dielectric body
12: Electrode
121: First capacitive electrode
122: Second capacitive electrode
123: Grounding electrode
124: Input-output electrode
125: Side electrode
2: Piezoelectric element
21: Vibrating electrode
22: Piezoelectric body
23: End electrode
31: First support portion
32: Second support portion
4: Electrically conductive joining material
5: Lid body

The invention claimed is:

1. A piezoelectric component, comprising:
    a support substrate;
    a piezoelectric element having an elongated shape, comprising excitation electrodes disposed on one principal surface and the other principal surface thereof, respectively, the excitation electrodes facing each other;
    a first support portion and a second support portion which are disposed between both ends in a longitudinal direction of the piezoelectric element and the support substrate; and
    an electrically conductive joining material which joins the first support portion and the second support portion to the ends of the piezoelectric element, respectively,
    a center of the piezoelectric element being offset with respect to an intermediate point between the first support portion and the second support portion as seen in a plan view of the piezoelectric component.

2. The piezoelectric component according to claim 1, wherein the center of the piezoelectric element is offset with respect to the intermediate point between the first support portion and the second support portion in the longitudinal direction of the piezoelectric element.

3. The piezoelectric component according to claim 1, wherein the center of the piezoelectric element is offset with respect to the intermediate point between the first support portion and the second support portion in a transverse direction which is perpendicular to the longitudinal direction of the piezoelectric element.

4. The piezoelectric component according to claim 1, wherein the longitudinal direction of the piezoelectric element is inclined with respect to a line segment connecting a barycenter of the first support portion and a barycenter of the second support portion.

5. The piezoelectric component according to claim 1, wherein, at each of the ends of the piezoelectric element, at least the other principal surface is in contact with the electrically conductive joining material.

6. The piezoelectric component according to claim 5, wherein, at each of the ends of the piezoelectric element, the other principal surface and at least part of a side surface of the piezoelectric element are covered with the electrically conductive joining material.

7. The piezoelectric component according to claim 5, wherein, at each of the ends of the piezoelectric element, the other principal surface, a side surface of the piezoelectric element, and at least part of the one principal surface are covered with the electrically conductive joining material.

8. The piezoelectric component according to claim 1, wherein the first support portion and the second support portion are each composed of at least two or more bumps.

* * * * *